United States Patent
Aoshima et al.

(10) Patent No.: US 9,101,061 B2
(45) Date of Patent: Aug. 4, 2015

(54) LAMINATE BODY, LAMINATE PLATE, MULTILAYER LAMINATE PLATE, PRINTED WIRING BOARD, AND METHOD FOR MANUFACTURE OF LAMINATE PLATE

(71) Applicant: HITACHI CHEMICAL COMPANY, LTD., Tokyo (JP)

(72) Inventors: Masahiro Aoshima, Ibaraki (JP); Yoshihiro Takahashi, Ibaraki (JP); Yuka Yamazaki, Saitama (JP); Yasuo Kamigata, Ibaraki (JP); Hikari Murai, Ibaraki (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 50 days.

(21) Appl. No.: 13/624,124

(22) Filed: Sep. 21, 2012

(65) Prior Publication Data
US 2013/0112460 A1    May 9, 2013

Related U.S. Application Data

(60) Provisional application No. 61/537,843, filed on Sep. 22, 2011.

(30) Foreign Application Priority Data

Sep. 12, 2012  (JP) ................................ 2012-200930

(51) Int. Cl.
  *H05K 1/03*   (2006.01)
  *B32B 17/06*  (2006.01)

(52) U.S. Cl.
  CPC ............ *H05K 1/0306* (2013.01); *B32B 17/064* (2013.01); *H05K 1/036* (2013.01); *B32B 2307/54* (2013.01); *H05K 1/0373* (2013.01); *Y10T 428/266* (2013.01)

(58) Field of Classification Search
CPC ... H05K 1/036; H05K 1/0306; H05K 1/0373; H05K 2201/0209
See application file for complete search history.

(56) References Cited

U.S. PATENT DOCUMENTS 6,528,145 B1 * 3/2003 Berger et al. ................. 428/156
2003/0010530 A1  1/2003 Scheel et al.
(Continued)

FOREIGN PATENT DOCUMENTS

CN  101321813 A  12/2008
CN  101646559 A  2/2010
(Continued)

OTHER PUBLICATIONS

Chinese Official Action, mailed Feb. 3, 2015, for No. 201210357137.3.

*Primary Examiner* — Jeremy C Norris
(74) *Attorney, Agent, or Firm* — Fitch Even Tabin & Flannery (57) ABSTRACT

A laminate body containing at least one resin composition layer and at least one glass substrate layer, wherein the resin composition layer includes a resin composition containing a thermosetting resin and an inorganic filler and the glass substrate layer accounts for from 10 to 95% by volume of the entire laminate body. A laminate plate containing at least one cured resin layer and at least one glass substrate layer, wherein the cured resin layer includes a cured product of the resin composition. A printed wiring board having the laminate plate and a wiring provided on the surface of the laminate plate. A method for producing the laminate plate including a cured resin layer forming step of forming the cured resin layer on the surface of a glass substrate.

22 Claims, 2 Drawing Sheets

(56) References Cited

U.S. PATENT DOCUMENTS

| | | |
|---|---|---|
| 2004/0025333 A1 | 2/2004 | Hirose et al. |
| 2009/0302462 A1 | 12/2009 | Hosomi et al. |
| 2010/0104877 A1 | 4/2010 | Zhu et al. |
| 2011/0114160 A1 | 5/2011 | Murashige et al. |

FOREIGN PATENT DOCUMENTS

| | | |
|---|---|---|
| CN | 102016962 A | 4/2011 |
| JP | 2000-243864 | 9/2000 |
| JP | 2004-182851 | 7/2004 |

* cited by examiner fig.1 fig.2

LAMINATE BODY, LAMINATE PLATE, MULTILAYER LAMINATE PLATE, PRINTED WIRING BOARD, AND METHOD FOR MANUFACTURE OF LAMINATE PLATE

This application claims priority under 35 USC 119(e) of prior U.S. provisional Application No. 61/537,843, filed Sep. 22, 2011, the contents of which are incorporated herein by reference in their entirety.

TECHNICAL FIELD

The present invention relates to a laminate body and a laminate plate suitable for use in semiconductor packages and printed wiring boards, to a printed wiring board and multilayer laminate plate using the laminate plate, and to a method for producing the laminate plate.

BACKGROUND ART

Recently, the demand for thinner and lighter electronic instruments has become increasingly greater, and thinning and densification of semiconductor packages and printed wiring boards has been promoted. For stably packaging electronic parts with satisfying the demand for thinning and densification thereof, it is important to prevent the warping to occur in packaging.

In packaging, one reason for the warping to occur in semiconductor packages is the difference in the thermal expansion coefficient between the laminate plate used in a semiconductor package and the silicon chips to be mounted on the surface of the laminate plate. Accordingly, for the laminate plate for semiconductor packages, efforts are made to make the thermal expansion coefficient of the laminate plate nearer to the thermal expansion coefficient of the silicon chips to be mounted thereon, or that is, to lower the thermal expansion coefficient of the laminate plate. Another reason is that the elastic modulus of the laminate plate is low, for which, therefore, it may be effective to increase the elastic modulus of the laminate plate. To that effect, for reducing the warping of a laminate plate, it is effective to lower the expansion coefficient of the laminate plate and to increase the elastic modulus thereof.

Various methods may be taken into consideration for lowering the thermal expansion coefficient of a laminate plate and for increasing the elastic modulus thereof; and among them there is known a method of lowering the thermal expansion coefficient of the resin for laminate plates and increasing the fill ration with an inorganic filler to be in the resin. In particular, high-rate filling with an inorganic filler is a method by which reduction in the thermal expansion coefficient and also enhancement of heat resistance and flame retardance could be expected (Patent Reference 1). However, it is known that increasing the inorganic filler content results in insulation reliability degradation, adhesiveness failure between resin and the wiring layer to be formed on the surface thereof, and pressing failure in laminate plate production, and increasing the filler content is therefore limited.

Some approaches have been tried to attain the intended purpose of thermal expansion coefficient reduction through selection or modification of resin. For example, a method of increasing the crosslinking density of the resin for wiring boards to thereby increase Tg thereof and to reduce the thermal expansion coefficient thereof is generally employed in the art (Patent References 2 and 3). However, increasing the crosslinking density is to shorten the molecular chain between functional groups, but shortening the molecular chain to a level overstepping a certain threshold is limitative in view of the reactivity of the resin, and may often bring about a problem in that the resin strength would be lowered. Consequently, there is also a limit on lowering the thermal expansion coefficient according to the method of increasing the crosslinking density.

As in the above, for conventional laminate plates, lowering the thermal expansion coefficient thereof and increasing the elastic modulus thereof have heretofore been tried by increasing the fill ration of the inorganic filler therein and by employing a resin having a low thermal expansion coefficient; however, these are being pushed to the limit.

As a method differing from the above, there has been made a trial of using a glass film as a layer having a thermal expansion coefficient almost the same as the thermal expansion coefficient of electronic parts (silicon chips) and laminating a resin on the glass film by pressing to thereby reduce the thermal shock stress of the resulting laminate (Patent Reference 4); however, the elastic modulus of the resin layer is low and the thermal expansion coefficient thereof is high, and therefore the method is insufficient for realizing the reduction in the warp of substrate.

CITATION LIST

Patent References

[Patent Reference 1] JP-A-2004-182851
[Patent Reference 2] JP-A-2000-243864
[Patent Reference 3] JP-A-2000-114727
[Patent Reference 4] Japanese Patent No. 4657554

SUMMARY OF THE INVENTION

Problems that the Invention is to Solve

As described above, the substrate obtained according to the production method in Patent Reference 4 still has a low elastic modulus and a high thermal expansion coefficient, and is therefore insufficient for realizing the reduction in the warp of substrate.

The present invention has been made in consideration of the situation as above, and its object is to provide a laminate plate and a multilayer laminate plate which have a low thermal expansion coefficient and a high elastic modulus, which can be prevented from warping and which hardly crack, to provide a laminate body suitable for producing the laminate plate and the multilayer laminate plate, to provide a printed wiring board using the laminate plate and the multilayer laminate plate, and to provide a production method for the laminate plate.

Means for Solving the Problems

Patent Reference 4 has no description at all relating to adding an inorganic filler to the resin for the substrate produced by laminating the resin on a glass film. From the description in Patent Reference 4, it is considered that incorporating an inorganic filler to the resin should be evaded.

Specifically, in Patent Reference 4, one indispensable constituent feature is that the thermal expansion action of the entire substrate is substantially determined by the glass film (Claim 1 in Patent Reference 4). In view of this, the influence of the resin on the thermal expansion action of the substrate must be as small as possible, and for this, the modulus of elasticity of the resin must be kept as low as possible (in case where the resin has a high elastic modulus, the resin having such a high elastic modulus would have a great influence on the thermal expansion action of the entire substrate). On the other hand, when an inorganic filler is incorporated in the resin, then the resin may have an increased elastic modulus. Accordingly, from the description in Patent Reference 4, incorporating an inorganic filler to the resin must be evaded.

In addition, when an inorganic filler is incorporated in the resin in Patent Reference 4, it may be considered that the glass substrate may be broken with ease, as starting from the inorganic filler therein. From this viewpoint, it is presumed that incorporating an inorganic filler in the resin would be evaded in Patent Reference 4.

At present, there exists no case of incorporating an inorganic filler in a resin layer in a laminate plate of a glass substrate layer and a resin layer as in Patent Reference 4.

Surprisingly, however, as a result of assiduous studies made for solving the above-mentioned problems, the present inventors have found that, in a laminate plate containing a cured resin layer and a glass substrate layer, when an inorganic filler is incorporated in the cured resin layer, then there can be obtained a laminate plate which has a low thermal expansion coefficient and a high elastic modulus, which is prevented from warping and which hardly cracks.

The present invention has been made on the basis of the finding as above, and includes the following [1] to [12] as the gist thereof.

[1] A laminate body containing at least one resin composition layer and at least one glass substrate layer, wherein the resin composition layer comprises a resin composition containing a thermosetting resin and an inorganic filler, and the glass substrate layer accounts for from 10 to 95% by volume of the entire laminate body.
[2] The laminate body according to the above [1], wherein the thickness of the glass substrate layer is from 30 µm to 200 µm.
[3] The laminate body according to the above [1] or [2], wherein the thermosetting resin is one or more selected from an epoxy resin, a phenolic resin, an unsaturated imide resin, a cyanate resin, an isocyanate resin, a benzoxazine resin, an oxetane resin, an amino resin, an unsaturated polyester resin, an allyl resin, a dicyclopentadiene resin, a silicone resin, a triazine resin and a melamine resin.
[4] The laminate body according to the above [1] to [3], wherein the inorganic filler is one or more selected from silica, alumina, talc, mica, aluminium hydroxide, magnesium hydroxide, calcium carbonate, aluminium borate and borosilicate glass.
[5] A laminate plate containing at least one cured resin layer and at least one glass substrate layer, wherein the cured resin layer comprises a cured product of a resin composition that contains a thermosetting resin and an inorganic filler, and the glass substrate layer accounts for from 10 to 95% by volume of the entire laminate plate.
[6] The laminate plate according to the above [5], which has a dynamic storage elastic modulus at 40° C. of from 10 GPa to 70 GPa.
[7] The laminate plate according to the above [5] or [6], which is obtained by heating and pressurizing the laminate body of any one of [1] to [4].
[8] A multilayer laminate plate containing multiple laminate plates, wherein at least one laminate plate is the laminate plate of any of [5] to [7].
[9] A printed wiring board having the laminate plate of any of [5] to [7] and a wiring provided on the surface of the laminate plate.
[10] A printed wiring board having the multilayer laminate plate of [8] and a wiring provided on the surface of the multilayer laminate plate.
[11] A method for producing a laminate plate of any of [5] to [7], the method comprising a cured resin layer forming step of forming a cured resin layer on the surface of a glass substrate.
[12] The method for producing a laminate plate according to [11], wherein the cured resin layer forming step is a step of applying the resin composition onto the glass substrate followed by drying and curing it.
[13] The method for producing a laminate plate according to [11], wherein the cured resin layer forming step is a step of laminating a film of the resin composition onto the glass substrate by the use of a vacuum laminator or a roll laminator followed by curing it.
[14] The method for producing a laminate plate according to [11], wherein the cured resin layer forming step is a step of arranging a film of the resin composition on the glass substrate followed by pressing and curing it.

Advantage of the Invention

According to the invention, there are provided a laminate plate and a multilayer laminate plate which have a low thermal expansion coefficient and a high elastic modulus, which can be prevented from warping and which hardly crack, a laminate body favorable for production of the laminate plate and the multilayer laminate plate, a printed wiring board using the laminate plate and the multilayer laminate plate, and a method for producing the laminate plate.

MODE FOR CARRYING OUT THE INVENTION

The laminate body, the laminate plate, the multilayer laminate plate, the printed wiring board, and the method for producing the laminate plate of the present invention are described in detail hereinunder.

In the present invention, the laminate body means one in which the constituent component of the thermosetting resin is uncured or semi-cured; and the laminate plate means one in which the constituent component of the thermosetting resin has been cured.

[Laminate Body]

The laminate body of the present invention contains at least one resin composition layer and at least one glass substrate layer, wherein the resin composition layer comprises a resin composition containing a thermosetting resin and an inorganic filler and the glass substrate layer accounts for from 10 to 95% by volume of the entire laminate body.

Preferably, the size of the laminate body of the present invention is selected within a range where the width is from 10 mm to 1000 mm and the length is from 10 mm to 3000 mm (in case where the laminate body is used as a roll, its length may be suitably applied thereto) from the viewpoint of the handleability thereof. More preferably, the size is within a range where the width is from 25 mm to 550 mm and the length is from 25 mm to 550 mm.

The thickness of the laminate body of the present invention is selected preferably within a range of from 35 µm to 20 mm, depending on the use thereof. More preferably, the thickness of the laminate body is from 50 to 1000 µm, even more preferably from 100 to 500 µm, still more preferably from 120 to 300 µm.

The laminate plate that is obtained by curing the resin composition layer in the laminate body of the present invention to give a cured resin layer has a glass substrate layer that has a low thermal expansion coefficient and a high elastic modulus of the same level as that of silicon chips, and therefore the laminate plate may have a low thermal expansion coefficient and a high elastic modulus; and consequently, the laminate plate is prevented from warping and hardly cracks. In particular, the laminate plate has a glass substrate layer having high heat resistance, and therefore noticeably has low thermal expansivity in the temperature region of from 100° C. to lower than Tg of the cured resin. In addition, the cured resin layer contains an inorganic filler, and therefore the cured resin layer can have a low thermal expansion coefficient and a high elastic modulus; and consequently, the laminate plate containing the cured resin layer can have a lower thermal expansion coefficient and a higher elastic modulus.

<Resin Composition>

The resin composition in the present invention contains a thermosetting resin and an inorganic filler.

<<Thermosetting Resin>>

Not specifically defined, the thermosetting resin includes, for example, an epoxy resin, a phenolic resin, an unsaturated imide resin, a cyanate resin, an isocyanate resin, a benzoxazine resin, an oxetane resin, an amino resin, an unsaturated polyester resin, an allyl resin, a dicyclopentadiene resin, a silicone resin, a triazine resin and a melamine resin. Of those, preferred are an epoxy resin and a cyanate resin as excellent in moldability and electric insulation quality.

The epoxy resin includes, for example, bisphenol A-type epoxy resin, bisphenol F-type epoxy resin, bisphenol S-type epoxy resin, phenol-novolak-type epoxy resin, cresol-novolak-type epoxy resin, bisphenol A-novolak-type epoxy resin, bisphenol F-novolak-type epoxy resin, stilbene-type epoxy resin, triazine skeleton-containing epoxy resin, fluorene skeleton-containing epoxy resin, triphenolphenolmethane-type epoxy resin, biphenyl-type epoxy resin, xylylene-type epoxy resin, biphenylaralkyl-type epoxy resin, naphthalene-type epoxy resin, dicyclopentadiene-type epoxy resin, alicyclic epoxy resin, diglycidyl ether compound of polyfunctional phenol and polycyclic aromatic compound such as anthracene, etc. Further mentioned are phosphorus-containing epoxy resins produced by introducing a phosphorus compound into these epoxy resins. Of those, preferred are biphenylaralkyl-type epoxy resin and naphthalene-type epoxy resin from the viewpoint of the heat resistance and the flame retardance thereof. One alone or two or more of these may be used here as combined.

The cyanate resin includes, for example, bisphenol-type cyanate resins such as novolak-type cyanate resin, bisphenol A-type cyanate resin, bisphenol E-type cyanate resin, tetramethylbisphenol F-type cyanate resin, etc., and their partially-triazinated prepolymers. Of those, preferred is novolak-type cyanate resin from the viewpoint of the heat resistance and the flame retardance thereof. One alone or two or more of these may be used here as combined.

The content of the thermosetting resin to be contained in the resin composition is preferably within a range of from 20 to 80% by mass relative to the mass obtained by subtracting the content of the inorganic filler from the total amount of the resin composition, more preferably from 40 to 80% by mass, even more preferably from 50 to 80% by mass, still more preferably from 60 to 75% by mass.

<<Inorganic Filler>>

The inorganic filler includes, for example, silica, alumina, talc, mica, aluminium hydroxide, magnesium hydroxide, calcium carbonate, aluminium borate and borosilicate glass.

Of those, preferred is silica from the viewpoint of the low thermal expansivity thereof, and more preferred is spherical amorphous silica of which the thermal expansion coefficient is 0.6 ppm/K or so and is extremely small and of which the flowability reduces little when highly filled in resin.

The spherical amorphous silica is preferably one having a cumulative 50% particle diameter of from 0.01 to 10 μm, more preferably from 0.03 to 5 μm.

The cumulative 50% particle diameter as referred to herein means the particle diameter of a powder at the point corresponding to just the 50% volume based on the total volume 100% of the powder, as read on the particle-size cumulative frequency distribution curve thereof; and this may be determined according to a laser diffractive scattering method using a particle size distribution analyzer, etc.

Preferably, the content of the inorganic filler in the resin composition is from 5 to 75% by volume of the total amount of the resin composition, more preferably from 15 to 70% by volume, even more preferably from 30 to 70% by volume. When the content of the inorganic filler is from 5 to 75% by volume of the resin composition, then the thermal expansion coefficient of the resin composition can be sufficiently reduced and the composition can have suitable flowability and is excellent in moldability. Specifically, when the content of the inorganic filler is 5% by volume or more, then the effect of reducing the thermal expansion coefficient can be sufficient; and when 75% by volume or less, then the flowability increases and the moldability is thereby bettered.

For expression in terms of % by mass for, for example, silica as the inorganic filler, the silica content in the resin composition is preferably from 8 to 85% by mass of the resin composition, more preferably from 24 to 82% by mass, even more preferably from 44 to 82% by mass.

Using silica having a mean primary particle diameter of at most 1 μm (nanosilica) as the inorganic filler makes it possible to form a microwiring on the cured resin layer of the laminate plate. Nanosilica is preferably one having a specific surface area of at least 20 m$^2$/g. From the viewpoint of reducing the surface profile after roughening treatment in the plating process for the laminate plate, the mean primary particle diameter is preferably at most 100 nm. The specific surface area can be measured according to a BET method.

The "mean primary particle diameter" as referred to herein means a mean particle diameter of the non-aggregated simple particle, and does not mean the mean diameter of aggregated particles, or that is, the secondary particle diameter thereof. The mean primary particle diameter can be determined, for example, by analyzing the powder with a laser diffractive particle sizer. As the inorganic filler of the type, preferred is fumed silica.

Further, the inorganic filler is preferably treated with a surface treatment agent such as a silane coupling agent or the like for enhancing the moisture resistance thereof, and is also preferably hydrophobized for enhancing the dispersibility thereof.

In case where a microwiring is formed on the cured resin layer of the laminate plate, the content of the inorganic filler is preferably at most 20% by mass of the resin composition. When the content is at most 20% by mass, then the layer can keep the good surface profile after roughening treatment and the plating characteristics thereof and also the interlaminar insulation reliability thereof can be prevented from worsening. On the other hand, it is expected that, by incorporating the inorganic filler thereinto, the thermal expansivity of the resin composition could be reduced and the elastic modulus thereof could be increased, and therefore, in case where weight is given to the thermal expansivity reduction and the elastic modulus increase along with to the microwiring formation, the content of the inorganic filler is preferably from 3 to 20% by mass, more preferably from 5 to 20% by mass.

<<Other Components>>

In addition to the above-mentioned components, a curing agent, a curing promoter, a thermoplastic resin, an elastomer, a flame retardant, a UV absorbent, an antioxidant, a photopolymerization initiator, a fluorescent brightener, an adhesiveness improver and the like may be added to the resin composition.

For example, in case where an epoxy resin is used, examples of the curing agent include polyfunctional phenol compounds such as phenol-novolak, cresol-novolak, etc.; amine compounds such as dicyandiamide, diaminodiphenylmethane, diaminodiphenylsulfone, etc.; acid anhydrides such as phthalic anhydride, pyromellitic anhydride, maleic anhydride, maleic anhydride copolymer, etc.; and polyimides. Different types of these curing agents may be used as combined.

Examples of the curing promoter, for example, for epoxy resin include, imidazoles and their derivatives; organic phosphorus compounds; secondary amines, tertiary amines, and quaternary ammonium salts.

Examples of the UV absorbent include benzotriazole-type UV absorbents.

The antioxidant includes hindered phenol-type or styrenated phenol-type antioxidants.

Examples of the photopolymerization initiator include benzophenones, benzyl ketals, thioxanthone-type photopolymerization initiators, etc.

Examples of the fluorescent brightener include stilbene derivatives and the like fluorescent brighteners.

Examples of the adhesiveness improver include urea compounds such as ureasilane, etc.; and silane coupling agents adhesiveness improvers.

<Resin Composition Layer>

The resin composition layer comprises the above-mentioned resin composition. The resin composition layer includes not only an uncured resin composition but also a semi-cured resin composition.

Preferably, the size of the resin composition layer in the present invention is selected within a range where the width is from 10 mm to 1000 mm and the length is from 10 mm to 3000 mm (in case where the laminate body is used as a roll, its length may be suitably applied thereto). More preferably, the size is within a range where the width is from 25 mm to 550 mm and the length is from 25 mm to 550 mm from the viewpoint of the handleability of the layer.

Preferably, the thickness of the resin composition layer in the present invention is selected within a range of from 3 μm to 200 μm/layer. From the viewpoint of lowering the thermal expansion coefficient of the laminate body and the laminate plate and increasing the elastic modulus thereof, the thickness of the resin composition is preferably from 3 to 150 μm/layer, more preferably from 3 to 100 μm, even more preferably from 5 to 50 μm, still more preferably from 5 to 30 μm <Glass Substrate Layer>

For the purpose of thinning the laminate body and from the viewpoint of the workability thereof, the thickness of the glass substrate layer is preferably from 30 to 200 μm/layer; and in consideration of the easiness in handling it and of the practicability thereof, the thickness is more preferably from 50 to 150 μm, even more preferably from 80 to 120 μm.

The thickness of the glass substrate layer as referred to herein indicates the mean thickness of the glass substrate layer. The mean thickness of the glass substrate layer may be determined by the use of any known thickness measuring device such as a micrometer, a thickness gauge or the like. For example, for a rectangular or square glass substrate layer, the thickness thereof is measured at four corners and at the center thereof with a micrometer, and the mean value of the found data is referred to as the mean thickness of the glass substrate layer. The material of the glass substrate layer may be glass such as alkali silicate glass, alkali-free, quartz glass or the like, but from the viewpoint of the low thermal expansivity thereof, preferred is borosilicate glass.

Preferably, the size of the glass substrate layer in the present invention is selected within a range where the width is from 10 mm to 1000 mm and the length is from 10 mm to 3000 mm (in case where the laminate body is used as a roll, its length may be suitably applied thereto). More preferably, the width is within a range of from 25 mm to 550 mm and the length is from 25 mm to 550 mm from the viewpoint of the handleability of the layer.

The thermal expansion coefficient of the glass substrate layer is preferably nearer to the thermal expansion coefficient (3 ppm/° C. or so) of silicon chips since the laminate body or the laminate plate to be obtained from the laminate body can be well prevented from warping, and is more preferably at most 8 ppm/° C., even more preferably at most 6 ppm/° C., still more preferably at most 4 ppm/° C.

The storage elastic modulus at 40° C. of the glass substrate layer is preferably larger, and is more preferably at least 20 GPa, even more preferably at least 25 GPa, still more preferably at least 30 GPa.

The glass substrate layer accounts for preferably from 10 to 95% by volume, more preferably 15 to 90% by volume, and still more preferably 20 to 85% by volume, based on the entire laminate body. The content of the glass substrate of 10% by volume or more is advantageous in terms of obtaining a laminate body having a low thermal expansion coefficient and a high elastic modulus. In contrast, the content of the glass substrate of 95% by volume or less is advantageous in terms of processability and handleability (ease in handling).

<Interlaminar Insulation Composition Layer>

The laminate body of the present invention may have an interlaminar insulation composition layer for enhancing the adhesiveness thereof to the conductor layer to be mentioned below.

Specifically, as described below, when a printed wiring body is produced by the use of the laminate plate of the present invention, a conductor layer may be formed on the surface of the laminate plate produced by curing the laminate body, by plating or the like thereon. As the case may be, a metal foil (conductor layer) may be attached thereto to give a metal foil-having laminate body or laminate plate. In these cases, a conductor layer may be formed on the resin composition layer or on the cured resin layer formed by curing the resin composition layer; however, an interlaminar insulation composition layer or a cured interlaminar insulation layer formed by curing the interlaminar insulation composition layer may be additionally formed on the resin composition layer or the cured resin layer, and thereafter a conductor layer may be formed thereon. In this case, when the interlaminar insulation composition layer having high adhesiveness to the conductor layer is used, then the adhesiveness between the laminate plate and the conductor layer can be bettered.

As described below, the laminate plate may be desmeared after formation of via holes therein. In this case, when the interlaminar insulation composition layer excellent in desmearing resistance is provided, then the surface of the laminate plate (that is, the interlaminar insulation layer formed by curing the interlaminar insulation composition layer) can be prevented from being too much roughened, and therefore a fine wiring pattern can be formed on the surface.

The configuration of the laminate body having the interlaminar insulation composition layer as in the above may be, for example, a three-layer configuration of:

glass substrate layer/resin composition layer/interlaminar insulation composition layer, or may also be a five-layer configuration of:

interlaminar insulation composition layer/resin composition layer/glass substrate layer/resin composition layer/interlaminar insulation composition layer.

The expression of "glass substrate layer/resin composition layer/interlaminar insulation composition layer" means that the glass substrate layer, the resin composition layer and the interlaminar insulation composition layer are laminated in that order. The same shall apply also to the expression for the five-layer configuration.

Any other configuration than the above-mentioned cases is employable here, in which an interlaminar insulation composition can be arranged between the conductor layer and the laminate body of the present invention, and the invention is not specifically limited to the above-mentioned cases.

Not specifically defined, the material of the interlaminar insulation composition layer may be, for example, the above-mentioned resin composition, for which, however, resin is preferably selected from the viewpoint of enhancing the adhesiveness thereto to conductor layer. The interlaminar insulation composition layer may contain an inorganic filler, or may not contain it.

<Adhesive Layer>

The laminate body of the present invention has a resin composition layer containing a thermosetting resin and an inorganic filler, and in addition thereto, may further have an adhesive layer containing a thermosetting resin but not containing an inorganic filler. The adhesive layer is arranged, for example, between the glass substrate layer and the resin composition layer, and is used for the purpose of enhancing the adhesiveness between the two layers.

<Proportion of Layers in Laminate Body>

Preferably, in the present invention, the resin composition layer accounts for from 5 to 60% by volume relative to the entire laminate body from the viewpoint of obtaining a laminate plate having a low thermal expansion coefficient and having a high elastic modulus, more preferably from 5 to 55% by volume, even more preferably from 10 to 50% by volume, still more preferably from 20 to 40% by volume.

Preferably, in the present invention, the glass substrate layer accounts for from 20 to 90% by volume relative to the entire laminate body from the viewpoint of obtaining a laminate plate having a low thermal expansion coefficient and having a high elastic modulus, more preferably from 30 to 85% by volume, even more preferably from 35 to 80% by volume, still more preferably from 40 to 75% by volume.

In case where the laminate body has an interlaminar insulation layer, preferably, the interlaminar insulation layer accounts for from 1 to 20% by volume relative to the entire laminate body, more preferably from 2 to 15% by volume, even more preferably from 3 to 10% by volume.

In case where the laminate body has an adhesive layer, preferably, the adhesive layer accounts for from 1 to 20% by volume relative to the entire laminate body, more preferably from 2 to 15% by volume, even more preferably from 3 to 10% by volume.

<Support Film and Protective Film>

The above-mentioned laminate body may have a support film and a protective film on the surface thereof. The support film and the protective film are described in detail in the next section of the description of the production method for the laminate body.

[Production Method for Laminate Body]

The production method for the laminate body is not specifically defined. The laminate body may be produced by lamination of a film of the resin composition onto a glass substrate, or by coating a glass substrate with the resin composition, etc. Of those, the lamination method is preferred as the product is easy to produce.

Next, the production method is described in detail.

<Production Method for Laminate Body by Lamination>

The above-mentioned laminate body is favorably produced through pressure lamination such as vacuum lamination or roll lamination, in which an adhesive film using the above-mentioned resin composition is laminated on a glass substrate. The adhesive film is described below. For the vacuum lamination or roll lamination, usable is any commercially-available vacuum laminator or roll laminator.

The thermosetting resin in the above-mentioned resin composition and the interlaminar insulation composition mentioned above are preferably those capable of melting at a temperature not higher than the temperature in lamination. For example, lamination with a vacuum laminator or a roll laminator is generally carried out at 140° C. or lower, and therefore, the thermosetting resin in the above-mentioned resin composition and the interlaminar insulation composition mentioned above are preferably those capable of melting at 140° C. or lower.

First, the adhesive film is described, and then the lamination method using the adhesive film is described.

<<Adhesive Film>>

In case where the laminate body is produced by the use of a vacuum laminator or a pressure laminator, in general, the above-mentioned resin composition is prepared as an adhesive film thereof.

As the adhesive film for use in the present invention, preferred are those having a laminate configuration mentioned below.

(1) Support film/resin composition layer
(2) Support film/interlaminar insulation composition layer/resin composition layer Also preferred for use herein are those prepared by further laminating a protective film on the laminate configuration of the above (1) and (2) and having a laminate configuration mentioned below.

(3) Support film/resin composition layer/protective film
(4) Support film/interlaminar insulation composition layer/resin composition layer/protective film The protective film is formed on the side opposite to the support film relative to the resin composition layer of the present invention, and is used for preventing the resin composition layer from being contaminated with impurities or from being flawed.

One derived from the adhesive film by removing the support film and the protective film therefrom may be referred to as an adhesive film body.

The adhesive film having the laminate configuration of the above (1) to (4) may be produced according to any method known to those skilled in the art.

One example of producing the adhesive film of the above (1) comprises dissolving the above-mentioned resin composition in an organic solvent to prepare a varnish with the inorganic filler dispersed therein. Next, the varnish is applied to a support film that serves as a support, and then the organic solvent is evaporated away by heating, hot air blowing or the like, thereby forming the resin composition layer.

One example of producing the adhesive film of (2) comprises dissolving an interlaminar insulation composition in an organic solvent to prepare a varnish. Next, the varnish is applied to a support film, and then the organic solvent is evaporated away by heating, hot air blowing or the like, thereby forming the interlaminar insulation composition layer. Subsequently, in the same manner as in the above (1), the resin composition layer is formed on the surface of the interlaminar insulation composition layer.

One example of producing the adhesive film of (3) comprises dissolving the above-mentioned resin composition in an organic solvent to prepare a varnish with the inorganic filler dispersed therein. Next, the varnish is applied to one of a support film and a protective film, then the other of the support film and the protective film is arranged on the varnish, and the organic solvent is evaporated away by heating, hot air blowing or the like, thereby forming the resin composition layer.

One example of producing the adhesive film of (4) comprises dissolving the above-mentioned interlaminar insulation composition in an organic solvent to prepare a varnish. Then, the varnish is applied to a support film, and then the organic solvent is evaporated away by heating, hot air blowing or the like, thereby forming the interlaminar insulation composition layer. Subsequently, the interlaminar insulation composition layer side of the laminate is attached to the resin composition layer side of a laminate previously produced in the same manner as in the above (1), and the two are laminated by the use of a pressure laminator such as a vacuum laminator or a roll laminator to be mentioned below. Another example comprises forming an interlaminar insulation layer on a support film by the use of a varnish, then applying a resin composition varnish thereonto and arranging a protective film thereon, and removing the organic solvent by drying through heating, hot air blowing or the like, thereby forming the resin composition layer.

As the coating apparatus for the interlaminar insulation composition layer and the resin composition layer, herein employable is any coating apparatus known to those skilled in the art, such as a comma coater, a bar coater, a kiss coater, a roll coater, a gravure coater, a die coater, etc. It is desirable that the coating apparatus is suitably selected depending on the thickness of the film to be formed.

In the above-mentioned adhesive film, the interlaminar insulation composition layer and the resin composition layer may be semi-cured.

The support film serves as a support in producing the adhesive film, and when a multilayer printed wiring board is produced and when it is used, in general, it is peeled off or removed.

As the support film, for example, there may be mentioned polyolefins such as polyethylene, polyvinyl chloride, etc.; polyesters such as polyethylene terephthalate (hereinafter this may be abbreviated as "PET"), polyethylene naphthalate, etc.; polycarbonates, polyimides; and further release paper, as well as metal foils such as copper foil, aluminium foil, etc. In case where a copper foil is used as the support film, the copper film may be used as a conductor layer directly as it is for circuit formation. In this case, as the copper foil, there are mentioned rolled copper, electrolytic copper foil, etc., and in general, those having a thickness of from 2 µm to 36 µm are used. In case where a thin copper foil is used, a carrier-supported copper foil may be used for enhancing the workability thereof.

The support film may be mat-treated, corona-treated and also release-treated.

The thickness of the support film is generally from 10 µm to 150 µm, preferably from 25 to 50 µm. When thinner than 10 µm, the film would be difficult to handle. On the other hand, the support film is, in general, finally peeled off or removed, as described above, and therefore, when the thickness thereof is more than 150 µm, it is unfavorable from the viewpoint of energy saving.

The above-mentioned protective film is peeled off before lamination or hot pressing. The material of the protective film may be the same as that of the support film, or may differ from the latter. Not specifically defined, the thickness of the protective film may be on the same level as that of the support film, but is preferably within a range of from 1 to 40 µm.

<<Lamination Method Using the Above-Mentioned Adhesive Film>>

Next described is one example of the lamination method using the above-mentioned adhesive film.

In case where the adhesive film has a protective film, the protective film is removed and then the adhesive film is bonded to a glass substrate under pressure and under heat. Regarding the lamination condition, preferably, the adhesive film and the glass substrate are optionally pre-heated and then laminated at a bonding temperature (lamination temperature) of preferably from 60° C. to 140° C. and under a bonding pressure of preferably from 1 to 11 kgf/cm². In case where a vacuum laminator is used, preferably, the lamination is attained under a reduced pressure of a pneumatic pressure of at most 20 mmHg (26.7 hPa). The lamination method may be in a batch mode or in a continuous mode with rolls.

As described above, the adhesive film is laminated on the glass substrate, and then cooled to around room temperature. The support film may be peeled off, if desired.

<Production Method for Laminate Body by Coating>

The production method for the laminate body by coating is not specifically defined. For example, the above-mentioned resin composition is dissolved in an organic solvent to prepare a varnish with the inorganic filler dispersed therein. The varnish is applied onto a glass substrate, and the organic solvent is evaporated away by heating, hot air blowing or the like, thereby forming the resin composition layer. The resin composition layer may be further semi-cured. In that manner, the laminate body can be produced.

[Laminate Plate]

The laminate plate of the present invention contains at least one cured resin layer and at least one glass substrate layer, wherein the cured resin layer comprises a cured product of a resin composition that contains a thermosetting resin and an inorganic filler, and the glass substrate layer accounts for from 10 to 95% by volume of the entire laminate body.

The laminate plate suitably has a structure obtained by making the resin composition layer in the laminate body described above into a cured resin layer.

Preferably, the size of the laminate plate of the present invention is selected within a range where the width is from 10 mm to 1000 mm and the length is from 10 mm to 3000 mm (in case where the laminate plate is used as a roll, its length may be suitably applied thereto). More preferably, the size is within a range where the width is from 25 mm to 550 mm and the length is from 25 mm to 550 mm from the viewpoint of the handleability of the plate.

The thickness of the laminate plate of the present invention is selected preferably within a range of from 36 µm to 20 mm, depending on the use thereof. More preferably, the thickness of the laminate plate is from 50 to 1000 µm, even more preferably from 100 to 500 µm, still more preferably from 120 to 300 µm.

The details of the glass substrate layer and the resin composition are described in the section of the laminate body given hereinabove.

<Cured Resin Layer>

Preferably, the thickness of the cured resin layer is from 3 to 200 μm. When the thickness is at least 3 μm, then the laminate plate is prevented from cracking. When the thickness is at most 200 μm, then the thickness of the glass substrate could be relatively large and the laminate plate can therefore have a lowered thermal expansion coefficient and an increased elastic modulus. From these viewpoints, the thickness of the cured resin layer is more preferably from 3 to 150 μm, even more preferably from 3 to 100 μm, still more preferably from 5 to 50 μm, further preferably from 5 to 30 μm. However, the suitable range of the thickness of the cured resin layer may vary depending on the thickness of the glass substrate layer and the number of the layers, and the type of the cured resin layer and the number of the layers, and therefore the thickness of the cured resin layer can be suitably controlled.

The storage elastic modulus at 40° C. of the cured resin layer is preferably from 1 to 80 GPa. When the modulus is at least 1 GPa, then the glass substrate layer can be protected and the laminate plate can be prevented from cracking. When the modulus is at most 80 GPa, then the stress resulting from the difference in the thermal expansion coefficient between the glass substrate layer and the cured resin layer is retarded, and the laminate plate can be thereby prevented from warping and cracking. From these viewpoints, the storage elastic modulus of the cured resin layer is more preferably from 3 to 70 GPa, even more preferably from 5 to 60 GPa, still more preferably from 10 to 50 GPa, further more preferably from 20 to 50 GPa.

A metal foil of copper, aluminium, nickel or the like may be provided on one or both surfaces of the laminate plate. The metal plate may be any one for use for electric insulation materials, and is not specifically defined.

<Interlaminar Insulation Layer>

The laminate plate may have an interlaminar insulation layer. The interlaminar insulation layer is formed, for example, by curing the interlaminar insulation composition layer in the above-mentioned laminate body.

The configuration of the laminate plate having the interlaminar insulation layer may be a three-layer configuration of, for example:

glass substrate layer/cured resin layer/interlaminar insulation layer, or a five-layer configuration of:

interlaminar insulation layer/cured resin layer/glass substrate layer/cured resin layer/interlaminar insulation layer.

Any other configuration than the above-mentioned cases is employable here, in which an interlaminar insulation composition can be arranged between the conductor layer and the laminate body of the present invention, and the invention is not specifically limited to the above-mentioned cases.

<Characteristics of Laminate Plate>

The storage elastic modulus at 40° C. of the laminate plate is preferably from 10 to 70 GPa from the viewpoint of preventing the laminate plate from warping and cracking, more preferably from 20 to 60 GPa, even more preferably from 25 to 50 GPa, still more preferably from 25 to 45 GPa.

The mean thermal expansion coefficient of the laminate plate in a range of from 50 to 120° C. is preferably from 1 to 10 ppm/° C. from the viewpoint of preventing the laminate plate from warping and cracking, more preferably from 2 to 8 ppm/° C., even more preferably from 2 to 6 ppm/° C., still more preferably from 2 to 5 ppm/° C.

The mean thermal expansion coefficient of the laminate plate in a range of from 120 to 190° C. is preferably from 1 to 15 ppm/° C. from the viewpoint of preventing the laminate plate from warping and cracking, more preferably from 2 to 10 ppm/° C., even more preferably from 2 to 8 ppm/° C., still more preferably from 2 to 6 ppm/° C.

<Proportion of Each Layer in Laminate Plate>

From the viewpoint of obtaining the laminate plate having a low thermal expansion coefficient and a high elastic modulus, preferably, the cured resin layer in the present invention accounts for from 5 to 60% by volume of the entire laminate plate, more preferably from 5 to 55% by volume, even more preferably from 10 to 50% by volume, still more preferably from 20 to 40% by volume.

From the viewpoint of obtaining the laminate plate having a low thermal expansion coefficient and a high elastic modulus, preferably, the glass substrate layer in the present invention accounts for from 20 to 90% by volume of the entire laminate plate, more preferably from 30 to 85% by volume, even more preferably from 35 to 80% by volume, still more preferably from 40 to 75% by volume.

In case where the laminate plate has an interlaminar insulation layer, preferably, the interlaminar insulation layer accounts for from 1 to 20% by volume of the entire laminate plate, more preferably from 2 to 15% by volume, even more preferably from 3 to 10% by volume.

In case where the laminate plate has an adhesive layer, preferably, the adhesive layer accounts for from 1 to 20% by volume of the entire laminate plate, more preferably from 2 to 15% by volume, even more preferably from 3 to 10% by volume.

[Production Method for Laminate Plate]

The production method for the above-mentioned laminate plate is not specifically defined. Next, a concrete example of the production method for the laminate plate is described.

<Production Example for Laminate Plate by Thermal Curing>

In the laminate body obtained through the above-mentioned lamination, the support film is optionally peeled off, and then the resin composition layer is thermally cured to give a laminate plate.

The thermal curing condition is selected within a range of from 150° C. to 220° C. and from 20 minutes to 80 minutes, more preferably from 160° C. to 200° C. and from 30 minutes to 120 minutes. In case where a release-treated support film is used, the support film may be peeled off after thermal curing.

The method does not require pressurization in producing the laminate plate, in which, therefore, the laminate plate can be prevented from cracking during production.

<Production Example According to Pressing Method>

The laminate plate of the present invention may also be produced according to a pressing method.

For example, the laminate body obtained through the above-mentioned lamination may be heated under pressure and cured according to a pressing method to give the laminate plate.

In addition, the adhesive film and/or the adhesive film body prepared by removing the support film and the protective film from the adhesive film is stacked to a glass substrate, and heated under pressure and cured according to a pressing method to give the laminate plate.

Further, a B-stage one prepared by applying the resin composition onto a support followed by drying it may be stacked to a glass substrate, and heated under pressure and cured according to a pressing method to give the laminate plate.

[Multilayer Laminate Plate and its Production Method]

The multilayer laminate plate of the present invention contains multiple laminate plates, wherein at least one laminate plate is the laminate plate of the present invention.

The production method for the multilayer laminate plate is not specifically defined.

For example, a plurality of the above-mentioned laminate plates are multilayered via the adhesive film body prepared by removing the support film and the protective film from the above-mentioned adhesive film.

A plurality (for example, from 2 to 20) of the above-mentioned laminate bodies are stacked in layers and molded through lamination to give the multilayer laminate plate. Concretely, using a multistage press, a multistage vacuum press, a continuous molding machine, an autoclave molding machine or the like, the laminated bodies are molded at a temperature of from 100 to 250° C. or so, under a pressure of from 2 to 100 MPa or so, and for a heating time of from 0.1 to 5 hours or so.

[Printed Wiring Board and Its Production Method]

The printed wiring board of the present invention has the above-mentioned laminate plate or multilayer laminate plate, and a wiring formed on the surface of the laminate plate or the multilayer laminate plate.

Next described is the production method for the printed wiring board.

<Formation of Via-Holes>

The above-mentioned laminate plate is worked optionally according to a method of drilling, laser processing, plasma processing or a combination thereof, thereby forming via-holes or through-holes therein. As the laser, generally used is a carbon dioxide laser, a YAG laser, a UV laser, an excimer laser or the like. After the formation of via-holes, the plate may be desmeared with an oxidizing agent. As the oxidizing agent, preferred here are permanganates (potassium permanganate, sodium permanganate, etc.), bichromates, ozone, hydrogen peroxide/sulfuric acid (that is, mixture of hydrogen peroxide and sulfuric acid) and nitric acid; and more preferred is an aqueous sodium hydroxide solution of potassium permanganate, sodium permanganate or the like (aqueous alkaline permanganate solution).

<Formation of Conductor Layer>

Next, a conductor layer is formed on the cured resin layer on the surface of the laminate plate through dry plating or wet plating thereon.

For dry plating, employable is any known method of vapor deposition, sputtering, ion plating or the like.

In case of wet plating, first, the surface of the cured resin layer of the laminate plate is roughened with an oxidizing agent of a permanganate (potassium permanganate, sodium permanganate, etc.), a bichromate, ozone, hydrogen peroxide/sulfuric acid, nitric acid or the like to thereby form irregular anchors thereon. As the oxidizing agent, especially preferred is an aqueous sodium hydroxide solution of potassium permanganate, sodium permanganate or the like (aqueous alkaline permanganate solution). The roughening treatment may function also as the above-mentioned desmearing treatment. Next, a conductor layer is formed according to a method of combination of electroless plating and electrolytic plating. A plating resist having an opposite pattern to the intended conductor layer may be formed, and the conductor layer may be formed by electroless plating alone.

In a case of using a laminate body having, on the surface thereof a support film composed of a metal foil, the conductor layer formation step may be omitted.

<Formation of Wiring Pattern>

As the subsequent patterning method, for example, employable here is any known subtractive method, a semi-additive method or the like.

[Multilayer Printed Wiring Board and its Production Method]

As one embodiment of the above-mentioned printed wiring board, provided here is a multilayer printed wiring board by laminating multiple laminate plates each having a wiring pattern formed thereon as in the above.

For producing the multilayer printed wiring board of the type, a plurality of the above-mentioned laminated plates each with a wiring pattern formed thereon are laminated via the above-mentioned adhesive film arranged therebetween for multilayer formation. Subsequently, through-holes or blind via-holes are formed in the board by drilling or laser processing, and then an interlaminar wiring formed through plating or by the use of a conductive paste. According to the process, a multilayer printed wiring board is produced.

[Metal Foil-Attached Laminate Plate and Multilayer Laminate Plate, and their Production Method]

The above-mentioned laminate plate and multilayer laminate plate may be metal foil-attached laminate plate and multilayer laminate plate each having a metal foil of copper, aluminium, nickel or the like on one or both surfaces thereof.

The production method for the metal foil-attached laminate plate is not specifically defined. For example, as mentioned above, a metal foil may be used as the support film to produce a metal-foil attached laminate plate.

One or a plurality (for example, from 2 to 20) of the above-mentioned laminate plates produced through lamination or coating may be piled up, and a metal foil is arranged on one or both surfaces thereof, and these may be molded through lamination to give a metal foil-attached laminate plate.

Regarding the molding condition, any method of producing laminate plate or multilayer plate for electric insulating materials is usable here; and for example, using a multistage press, a multistage vacuum press, an automatic molding machine, an autoclave molding machine or the like, the laminate configuration may be molded at a temperature of from 100 to 250° C. or so, under a pressure of from 2 to 100 MPa or so, and for a heating time of from 0.1 to 5 hours or so.

<Evaluation Method for Thermal Expansion Coefficient>

The thermal expansion coefficient of the laminate plate may be measured, using a thermal mechanical analysis (TMA), a temperature-dependent 3D displacement analyzer (DIC, digital image correlation), a laser interferometer, etc.

<Evaluation Method for Elastic Modulus>

The elastic modulus of the laminate plate may be determined by measuring, for example, the storage elastic modulus thereof using a wide-area viscoelasticity measuring device, and also by measuring the bending modulus thereof as a static elastic modulus. The bending elastic modulus may be measured according to a three-point bending test.

EXAMPLES

Next, the present invention is described in more detail with reference to Examples and Comparative Examples; however, the present invention is not limited to these descriptions.

In Examples and Comparative Examples, "part" and "%" mean "part by mass" and "% by mass", respectively.

Figure 1:
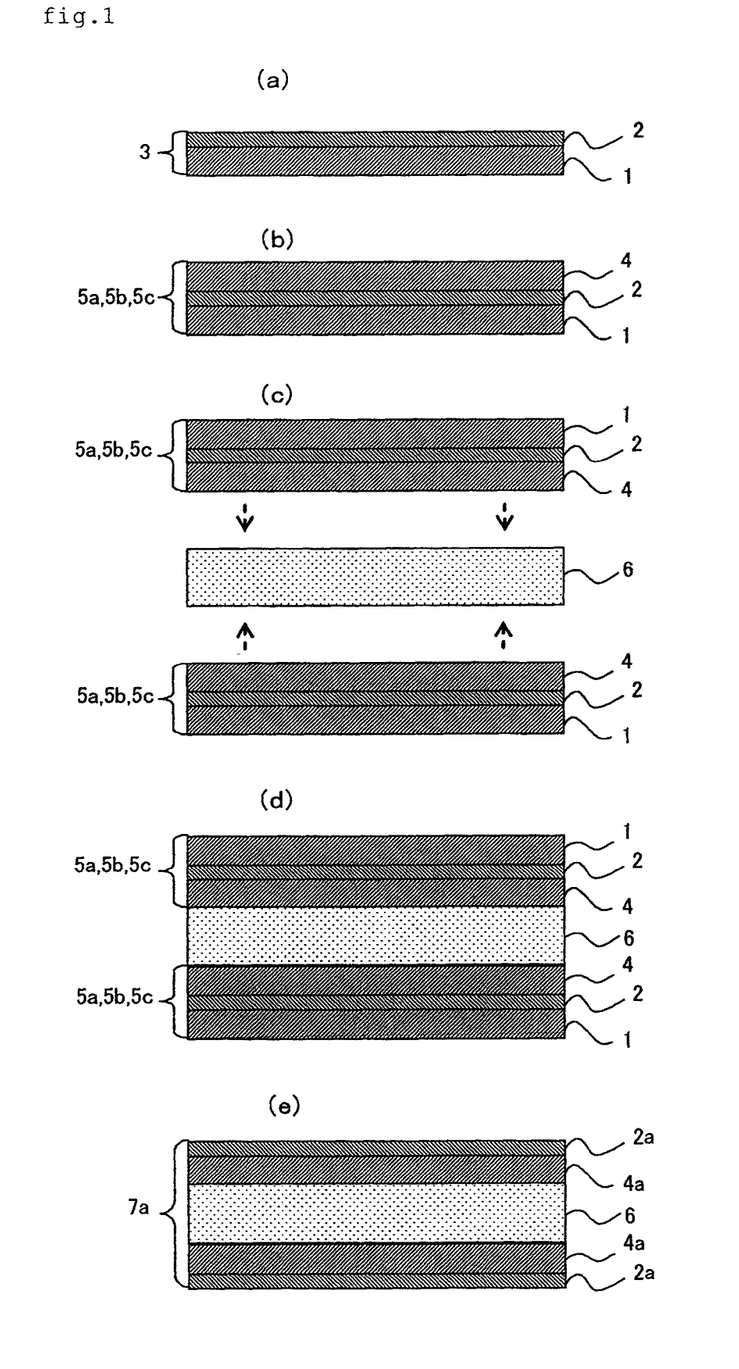
FIG. 1 This is a schematic cross-sectional view of explaining the production method of Examples 1, 2 and 4.
Figure 2:
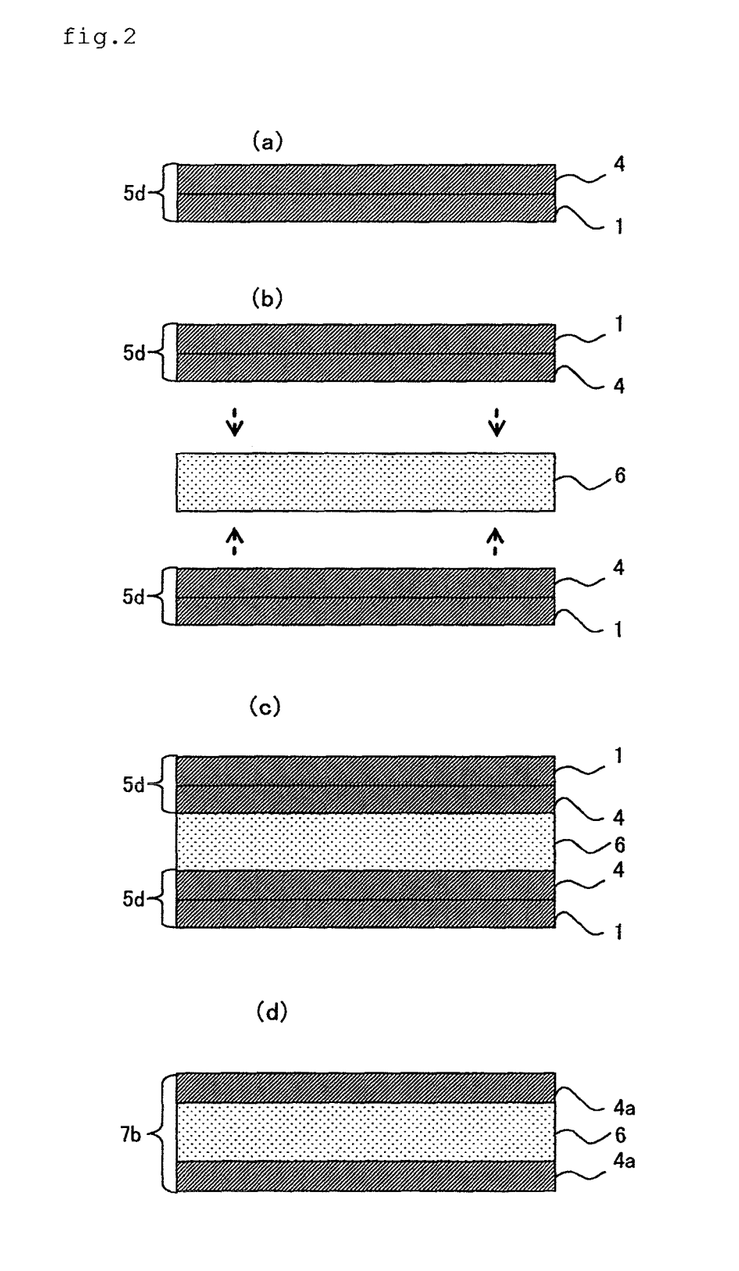
FIG. 2 This is a schematic cross-sectional view of explaining the production method of Example 5.

FIG. 1 is a schematic cross-sectional view of explaining the production method of Examples 1, 2 and 4; and FIG. 2 is a schematic cross-sectional view of explaining the production method of Example 5.

Example 1

<Production of Resin Film 3 (Laminate of Interlaminar Insulation Composition Layer 2 and Support Film 1)>

To 135.4 parts of a polyamide resin, Nippon Kayaku's "BPAM-155" (product name) dissolved in a dimethylacetamide solvent to have a concentration of 10%, added were 62.0 parts of an epoxy resin, Nippon Kayaku's "NC3000-H" (product name, concentration 100%) as a thermosetting resin, 23.5 parts of a triazine-containing phenolic novolak resin, DIC's "LA-1356-60P" (product name, concentration 60%) as a curing agent, 0.6 parts of 2-phenylimidazole, Shikoku Chemical Industry's "2PZ" (product name, concentration 100%) as a curing promoter, 8.8 parts of fumed silica, Nippon Aerosil's "AEROSIL R972" (product name, concentration 100%; mean particle diameter of primary particles, 16 nm; specific surface area according to BET method, 110±20 m$^2$/g) as an inorganic filler, and 3.6 parts of a polyester-modified polydimethylsiloxane, BYK Chemie Japan's "BYK-310" (product name, concentration 25%) as another component; and further, 314.3 parts of a dimethylacetamide solvent was added thereto. These were dissolved, mixed and processed with a bead mill to prepare a varnish.

As the support film 1, used here was a polyethylene terephthalate film (PET film) having a thickness of 38 μm; and using a comma coater, the varnish was applied onto the film and dried. The amount of the varnish was so controlled that the coating thickness could be 5 μm, and the drying temperature was 140° C. and the drying time was 3 minutes. Under the condition, a resin film 3 having a width of 270 mm was obtained, in which an interlaminar insulation composition layer 2 was formed on the support film 1 (FIG. 1(a)).

<Production of Varnish for Resin Composition Layer>

31.8 parts of an epoxy resin, Nippon Kayaku's "NC3000-H" (product name, concentration 100%) as a thermosetting resin, 7.2 parts of a triazine-containing cresol-novolak, DIC's "LA-3018-50P" (product name, concentration 50%), 5.1 parts of a phosphorus-containing phenolic resin, Sanko's "HCA-HQ" (product name, concentration 100%) and 4.4 parts of a phenol-novolak, DIC's "TD2131" (concentration 100%) as curing agents, 0.1 parts of 1-cyanoethyl-2-phenylimidazolium trimellitate, Shikoku Chemical Industry's "2PZCNS-PW" (product name, concentration 100%) as a curing promoter; and 78.6 parts of a silica filler, Admafine Techno's "SO-C2" (product name, concentration 100%, mean particle diameter of primary particles, 500 nm; specific surface area according to BET method; 6.8 m$^2$/g) as an inorganic filler which had been treated with an aminosilane coupling agent in a methyl isobutyl ketone solvent to have a solid concentration of 70%, were blended, and then 42.7 parts of methyl ethyl ketone was added thereto as an additional solvent. These were dissolved, mixed and processed with a bead mill to prepare a varnish for resin composition layer.

<Production of Adhesive Film 5a (Support Film 1/Interlaminar Insulation Composition Layer 2/Resin Composition Layer 4)>

The resin composition layer 4 was formed on the resin film 3 to give an adhesive film 5a.

The method is as follows: Using the above-mentioned resin film 3 (support film 1/interlaminar insulation composition layer 2), and using a comma coater, the varnish for resin composition layer was applied on the side of the interlayer insulation composition layer 2, and dried. The amount of the varnish was so controlled that the coating thickness could be 20 μm (as so defined that the interlaminar insulation composition layer 2 could be 5 μm, and the resin composition layer 4 could be 15 μm). The drying temperature was 105° C., and the drying time was 1.2 minutes, thus, the resin composition layer 4 was formed to give the adhesive film 5a having a width of 270 mm (FIG. 1(b)).

<Production of Laminate Plate (Interlaminar Insulation Layer/Cured Resin Layer/Glass Substrate Layer/Cured Resin Layer/Interlaminar Insulation Layer)>

As the glass substrate layer 6, used here was an ultrathin glass film, Nippon Electric Glass's "OA-10G" (product name, thickness 100 μm; 250×250 mm). On both surfaces of the glass substrate layer 6, the adhesive film 5a was so arranged that its resin composition layer 4 could face the glass substrate layer 6, and laminated using a batch-type vacuum pressure laminator "MVLP-500" (Meiki's product name) (FIG. 1(c) (d)). In this stage, the vacuum degree was at most 30 mmHg, the temperature was 90° C., and the pressure was 0.5 MPa.

After cooled to room temperature, the support film 1 was peeled off, and this was cured in dry air at 180° C. for 60 minutes. Thus cured, the interlaminar insulation composition layer 2 and the resin composition layer 4 formed an interlaminar insulation layer 2a and a cured resin layer 4a, respectively. In that manner, a five-layered laminate plate 7a (interlaminar insulation layer/cured resin layer/glass substrate layer/cured resin layer/interlaminar insulation layer) was obtained (FIG. 1(e)).

Example 2

<Production of Adhesive Film 5b (Support Film/Interlaminar Insulation Composition Layer/Resin Composition Layer)>

An adhesive film 5b of 250 mm×250 mm was produced according to the same process as that for the adhesive film 5a in Example 1, except that the coating thickness of the varnish was changed from 20 μm to 40 μm (as so defined that the interlaminar insulation composition layer 2 could be 5 μm, and the resin composition layer 4 could be 35 μm).

<Production of Laminate Plate (Interlaminar Insulation Layer/Cured Resin Layer/Glass Substrate Layer/Cured Resin Layer/Interlaminar Insulation Layer)>

A five-layered laminate plate (interlaminar insulation layer/cured resin layer/glass substrate layer/cured resin layer/interlaminar insulation layer) was produced according to the same process as in Example 1 except that the above-mentioned adhesive film 5b was used in place of the adhesive film 5a.

Example 3

<Production of Laminate Plate (Interlaminar Insulation Layer/Cured Resin Layer/Interlaminar Insulation Layer/Cured Resin Layer/Glass Substrate Layer/Cured Resin Layer/Interlaminar Insulation Layer/Cured Resin Layer/Interlaminar Insulation Layer)>

As the glass substrate layer, used here was an ultrathin glass film, Nippon Electric Glass's "OA-10G" (product name, thickness 100 μm; 250×250 mm). On both surfaces of the glass substrate, the adhesive film 5b was so arranged that its cured resin layer could face the glass substrate, and laminated using a batch-type vacuum pressure laminator "MVLP-500" (Meiki's product name). In this stage, the vacuum degree was at most 30 mmHg, the temperature was 90° C., and the pressure was 0.5 MPa. After cooled to room temperature, the support film was peeled off.

On the interlaminar insulation composition layer which was exposed as a result of the peeling off of the support film, the above-mentioned adhesive film 5b was so arranged that its cured resin layer could face the interlaminar insulation composition layer, and laminated using a batch-type vacuum pressure laminator "MVLP-500" (Meiki's product name). In this stage, the vacuum degree was at most 30 mmHg, the temperature was 65° C., and the pressure was 0.5 MPa.

After cooled to room temperature, the support film was peeled off, and this was cured in dry air at 180° C. for 60 minutes. In that manner, a nine-layered laminate plate (interlaminar insulation layer/cured resin layer/interlaminar insulation layer/cured resin layer/glass substrate layer/cured resin layer/interlaminar insulation layer/cured resin layer/interlaminar insulation layer) was obtained.

Example 4

<Production of Adhesive Film 5c (Support Film/Interlaminar Insulation Composition Layer/Resin Composition Layer)>

An adhesive film 5c having a width of 270 mm was produced according to the same process as that for the adhesive film 5a in Example 1, except that the coating thickness of the varnish was changed from 20 μm to 30 μm (as so defined that the interlaminar insulation composition layer 2 could be 5 μm, and the resin composition layer 4 could be 25 μm).

<Production of Laminate Plate (Interlaminar Insulation Layer/Cured Resin Layer/Glass Substrate Layer/Cured Resin Layer/Interlaminar Insulation Layer)>

A five-layered laminate plate (interlaminar insulation layer/cured resin layer/glass substrate layer/cured resin layer/interlaminar insulation layer) was produced according to the same process as in Example 1 except that the above-mentioned adhesive film 5c was used in place of the adhesive film 5a and as a glass substrate 6, a glass substrate having a thickness of 150 μm in place of that of 100 μm thickness.

Example 5

<Production of Varnish for Resin Composition Layer>

To 135.4 parts of a polyamide resin, Nippon Kayaku's "BPAM-155" (product name) dissolved in a dimethylacetamide solvent to have a concentration of 10%, added were 62.0 parts of an epoxy resin, Nippon Kayaku's "NC3000-H" (product name, concentration 100%) as a thermosetting resin, 23.5 parts of a triazine-containing phenolic novolak resin, DIC's "LA-1356-60P" (product name, concentration 60%) as a curing agent, 0.6 parts of 2-phenylimidazole, Shikoku Chemical Industry's "2PZ" (product name, concentration 100%) as a curing promoter, 4.8 parts of fumed silica, Nippon Aerosil's "AEROSIL R972" (product name, concentration 100%, mean particle diameter of primary particles: 16 nm, specific surface area according to BET method: 110±20 $m^2/g$) as an inorganic filler, and 1.7 parts of a polyester-modified polydimethylsiloxane, BYK Chemie Japan's "BYK-310" (product name, concentration 25%) as an other component; and further, 66.3 parts of a dimethylacetamide solvent was added thereto. Subsequently, using a disperser (Nanomizer, product name, by Yoshida Kikai), these were processed to give a uniform resin varnish.

<Production of Adhesive Film 5d (Support Film 1/Resin Composition Layer 4)>

The resin composition layer 4 was formed on the support film 1 to give an adhesive film 5d (FIG. 2(a)).

The method is as follows: Using a comma coater, the resin varnish was applied on the release-treated side of a release-treated polyethylene terephthalate (PET) film (PET-38X, by Lintec, product name) serving as a support film in such a manner that the thickness thereof after dried could be 20 μm, and then dried at 140° C. for 5 minutes thereby producing the adhesive film 5d comprising the resin composition layer 4 and the support film 1 and having a width of 270 mm.

<Production of Laminate Plate (Cured Resin Layer/Glass Substrate Layer/Cured Resin Layer)>

As the glass substrate layer 6, used here was an ultrathin glass film, Nippon Electric Glass's "OA-10G" (product name, thickness 150 μm; 250×250 mm). On both surfaces of the glass substrate layer 6, the adhesive film 5d was so arranged that its resin composition layer 4 could face the glass substrate layer 6, and laminated using a batch-type vacuum pressure laminator "MVLP-500" (Meiki's product name) (FIG. 2(b), (c)). In this stage, the vacuum degree was at most 30 mmHg, the temperature was 120° C., and the pressure was 0.5 MPa.

After cooled to room temperature, the support film 1 was peeled off, and this was cured in dry air at 180° C. for 60 minutes. Thus cured, the resin composition layer 4 formed a cured resin layer 4a. In that manner, a three-layered laminate plate 7b (cured resin layer/glass substrate layer/cured resin layer) was obtained (FIG. 2(d)).

Comparative Example 1

<Production or Resin Film>

A resin film was produced according to the same process as that for the resin film 3 in Example 2 except that the inorganic filler (fumed silica) was not added thereto.

<Production of Varnish>

A varnish was produced according to the same process as that for the varnish for resin composition layer in Example 2 except that the inorganic filler (silica filler) was not added thereto.

<Production of Adhesive Film C>

An adhesive film (support film/interlaminar insulation composition layer/resin composition layer) was produced according to the same process as in Example 2 except that the above-mentioned resin film and varnish were used in place of the resin film 3 and the varnish for resin composition layer in Example 2.

<Production of Laminate Plate (Interlaminar Insulation Layer/Cured Resin Layer/Glass Substrate Layer/Cured Resin Layer/Interlaminar Insulation Layer)>

A five-layered laminate plate (interlaminar insulation layer/cured resin layer/glass substrate layer/cured resin layer/interlaminar insulation layer) was obtained according to the same process as in Example 2 except that the above-mentioned adhesive film was used in place of the adhesive film 5a in Example 2.

Reference Example 1

Next, a laminate plate using a prepreg, which is a commonly-used laminate plate for semiconductor packages or printed wiring boards, is produced as follows:

<Production of Solution of Unsaturated Maleimide Group-Having Resin Composition>

In a heatable and coolable reactor having a capacity of 2 liters and equipped with a thermometer, a stirrer and a moisture meter provided with a reflux condenser tube, 69.10 g of 4,4'-bis(4-aminophenoxy)biphenyl, 429.90 g of bis(4-maleimidophenyl)sulfone, 41.00 g of p-aminophenol and 360.00 g of propylene glycol monomethyl ether were put, and reacted at the reflux temperature for 2 hours, thereby giving a solution of a resin composition having an acidic substituent and an unsaturated maleimide group.

<Production of Thermosetting Resin Composition-Containing Varnish>

The following were used here.
(1) The above-mentioned, unsaturated maleimide group-having resin composition solution, as a curing agent (A);
(2) A bifunctional naphthalene-type epoxy resin [DIC's product name, HP-4032D] as a thermosetting resin (B);
(3) An isocyanate-masked imidazole [Daiichi Kogyo Seiyaku's product name, G8009L] as a modified imidazole (C),
(4) A molten silica [Admatec's product name, SC2050-KC; concentration 100%; mean particle diameter of primary particles, 500 nm; specific surface area according to BET method, 6.8 m$^2$/g] as an inorganic filler (D),
(5) A phosphorus-containing phenolic resin [Sanko Chemical's product name, HCA-HQ, phosphorus content 9.6% by mass] as a flame retardance-imparting, phosphorus-containing compound (E),
(6) A crosslinked acrylonitrile-butadiene rubber (NBR) particles [JSR's product name, XER-91] as a compound (F) that enables chemical roughening, and
(7) Methyl ethyl ketone as a diluting solvent.

These were mixed in the blend ratio (part by mass) as shown in Table 1 to prepare a uniform varnish (G) having a resin content (total of resin components) of 65% by mass.

TABLE 1

|  | part by mass |
|---|---|
| Curing Agent (A) | 50 |
| Thermosetting Resin (B) | 49.5 |
| Modified Imidazole (C) | 0.5 |
| Inorganic Filler (D) | 40 |
| Phosphorus-Containing Compound (E) | 3 |
| Compound (F) | 1 |

<Production of Prepreg of Thermosetting Resin Composition>

The above-mentioned varnish (G) was applied onto E-glass cloths each having a different thickness by dipping, and then dried under heat at 160° C. for 10 minutes to give a prepreg. Regarding the type of the E-glass cloth, used here was Asahi Kasei E-Materials' IPC standard 2116 and a 250 mm×250 mm prepreg was produced. The resin content in the prepreg prepared here was 50% by mass. Three these prepregs were combined, and an electrolytic copper foil having a thickness of 12 μm was arranged over and under them, and pressed under a pressure of 3.0 MPa at a temperature of 235° C. for 120 minutes to give a copper-clad laminate plate.

[Measurement]

The laminate plates obtained in the above-mentioned Examples, Comparative Example and Reference Example were analyzed and evaluated for the properties thereof, according to the methods mentioned below.

(1) Measurement of Thermal Expansion Coefficient

A test piece of 4 mm×30 mm was cut out of the laminate plate. In case where a copper-clad laminate plate is tested, the plate was dipped in a copper etching solution to remove the copper foil, and the test piece was cut out of it.

Using a TMA tester (by DuPont, TMA2940), the thermal expansion behavior of the test piece at lower than Tg was observed and evaluated. Concretely, the test piece was heated at a heating rate of 5° C./min, then within a measurement range of from 20 to 200° C. in the 1st run, and from −10 to 280° C. in the 2nd run, this was analyzed according to a tensile method under a load of 5 g and with a chuck distance of 10 mm. The mean thermal expansion coefficient of the sample within a range of from 50 to 120° C. and within a range of from 120 to 190° C. was determined. The results are shown in Table 2.

(2) Measurement of Storage Elastic Modulus

A test piece of 4 mm×30 mm was cut out of the laminate plate. In case where a copper-clad laminate plate was tested, the plate was dipped in a copper etching solution to remove the copper foil, and the test piece was cut out of it.

Using a wide-area viscoelasticity meter (Rheology's DVE-V4 Model), the test piece was analyzed for the storage elastic modulus at 40° C. under the conditions of a span distance of 20 mm, a frequency of 10 Hz and a vibration displacement of from 1 to 3 μm (stop excitation). The results are shown in Table 2.

TABLE 2

| | Ratio of Glass | Thermal Expansion Coefficient (ppm/° C.) | | Elastic Modulus (GPa) |
|---|---|---|---|---|
| | (% by volume) | 50-120° C. | 120-190° C. | 40° C. |
| Example 1 | 71 | 3.8 | 2.4 | 29.8 |
| Example 2 | 56 | 3.9 | 2.5 | 32.4 |
| Example 3 | 38 | 4.6 | 2.9 | 15.1 |
| Example 4 | 71 | 2.8 | 3.1 | 39.4 |
| Example 5 | 79 | 2.7 | 3.0 | 42.0 |
| Comparative Example 1 | 56 | 5.5 | 4.5 | 14.0 |
| Reference Example 1 | 0 | 13.1 | 15.3 | 24.7 |

As obvious from Table 2, Examples 1 to 5 of the present invention have a low thermal expansion coefficient at 50 to 120° C. and have a high elastic modulus at 40° C. In addition, it is known that, within a high-temperature range of from 120 to 190° C., the thermal expansion coefficient of Reference Example 1 was higher than that in a low-temperature range (50 to 120° C.), however, Examples 1 to 5 have low thermal expansivity of the same level both in the high-temperature range and in the low-temperature range. Accordingly, Examples 1 of the present invention maintain low thermal expansivity not only in a low-temperature range but also in a high-temperature range.

DESCRIPTION OF REFERENCE NUMERALS AND SIGNS

1 Support Film
2 Interlaminar Insulation Composition Layer
2a Interlaminar Insulation Layer
3 Resin Film
4 Resin Composition Layer
4a Cured Resin Layer
5a, 5b, 5c, 5d Adhesive Film
6 Glass Substrate Layer
7a, 7b Laminate Plate

The invention claimed is:

1. A laminate body containing at least one resin composition layer and at least one glass substrate layer, wherein the resin composition layer comprises a resin composition containing a thermosetting resin and an inorganic filler, the glass substrate layer accounts for from 10 to 95% by volume of the entire laminate body, and the at least one glass substrate layer consists of glass material.

2. The laminate body according to claim 1, wherein the thickness of the at least one glass substrate layer is from 30 μm to 200 μm per layer.

3. The laminate body according to claim 1, wherein the thermosetting resin is one or more selected from an epoxy resin, a phenolic resin, an unsaturated imide resin, a cyanate resin, an isocyanate resin, a benzoxazine resin, an oxetane resin, an amino resin, an unsaturated polyester resin, an allyl resin, a dicyclopentadiene resin, a silicone resin, a triazine resin and a melamine resin.

4. The laminate body according to claim 1, wherein the inorganic filler is one or more selected from silica, alumina, talc, mica, aluminium hydroxide, magnesium hydroxide, calcium carbonate, aluminium borate and borosilicate glass.

5. A laminate plate containing at least one cured resin layer and at least one glass substrate layer, wherein the cured resin layer comprises a cured product of a resin composition that contains a thermosetting resin and an inorganic filler, the glass substrate layer accounts for from 10 to 95% by volume of the entire laminate plate, and the at least one glass substrate layer consists of glass material.

6. The laminate plate according to claim 5, which has a storage elastic modulus at 40° C. of from 10 GPa to 70 GPa.

7. The laminate plate according to claim 5, which is obtained by heating a laminate body containing at least one resin composition layer and the at least one glass substrate layer, so as to thermally cure the at least one resin composition layer, wherein the resin composition layer comprises the resin composition containing a thermosetting resin and an inorganic filler, and the glass substrate layer accounts for from 10 to 95% by volume of the entire laminate body.

8. A multilayer laminate plate containing multiple laminate plates, wherein at least one laminate plate is the laminate plate of claim 5.

9. A printed wiring board having the laminate plate of claim 5 and a wiring provided on the surface of the laminate plate.

10. A printed wiring board having the multilayer laminate plate of claim 8 and a wiring provided on the surface of the multilayer laminate plate.

11. A method for producing a laminate plate of claim 5, the method comprising a cured resin layer forming step of forming a cured resin layer on the surface of a glass substrate.

12. The method for producing a laminate plate according to claim 11, wherein the cured resin layer forming step is a step of applying the resin composition onto the glass substrate followed by drying and curing the resin composition.

13. The method for producing a laminate plate according to claim 11, wherein the cured resin layer forming step is a step of laminating a film of the resin composition onto the glass substrate by the use of a vacuum laminator or a roll laminator followed by curing the film.

14. The method for producing a laminate plate according to claim 11, wherein the cured resin layer forming step is a step of arranging a film of the resin composition on the glass substrate followed by pressing and curing the film.

15. The laminate body according to claim 1, wherein said glass material is selected from the group consisting of alkali silicate glass, alkali-free glass, quartz glass and borosilicate glass.

16. The laminate plate according to claim 5, wherein said glass material is selected from the group consisting of alkali silicate glass, alkali-free glass, quartz glass and borosilicate glass.

17. The laminate body according to claim 1, wherein content of inorganic filler in the resin composition is 5 to 75% by volume of the total amount of the resin composition.

18. The laminate body according to claim 2, wherein the thickness of the at least one resin composition layer is from 3 μm to 200 μm per layer.

19. The laminate plate according to claim 6, which has a mean thermal expansion coefficient in a range of from 50° to 120° C. of 1 to 10 ppm/° C.

20. The laminate plate according to claim 6, which has a mean thermal expansion coefficient in a range of from 120° to 190° C. of 1 to 15 ppm/° C.

21. The laminate body according to claim 1, wherein said at least one glass substrate layer includes a film of said glass material.

22. The laminate plate according to claim 5, wherein said at least one glass substrate layer includes a film of said glass material.

* * * * *